(12) United States Patent
Nakanishi et al.

(10) Patent No.: US 9,887,231 B2
(45) Date of Patent: Feb. 6, 2018

(54) SOLID-STATE IMAGING DEVICE AND METHOD OF MANUFACTURING THE DEVICE

(71) Applicant: Panasonic Intellectual Property Management Co., Ltd., Osaka (JP)

(72) Inventors: Kentaro Nakanishi, Nara (JP); Junji Hirase, Osaka (JP); Kosaku Saeki, Osaka (JP); Yoshinori Takami, Toyama (JP); Takeshi Hidaka, Miyazaki (JP); Tokuhiko Tamaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/555,153

(22) Filed: Nov. 26, 2014

(65) Prior Publication Data

US 2015/0084106 A1   Mar. 26, 2015

Related U.S. Application Data

(63) Continuation of application No. PCT/JP2013/003096, filed on May 15, 2013.

(30) Foreign Application Priority Data

Jun. 26, 2012 (JP) .................................. 2012-143040

(51) Int. Cl.
*H01L 27/146* (2006.01)

(52) U.S. Cl.
CPC .... *H01L 27/14643* (2013.01); *H01L 27/1461* (2013.01); *H01L 27/14612* (2013.01); *H01L 27/14689* (2013.01)

(58) Field of Classification Search
CPC ........... H01L 27/1461; H01L 27/14643; H01L 27/14689; H01L 27/14612;
(Continued)

(56) References Cited

U.S. PATENT DOCUMENTS

| | | | |
|---|---|---|---|
| 6,768,149 B1* | 7/2004 | Mann ................ | H01L 27/14603 250/208.1 |
| 2004/0188729 A1* | 9/2004 | Uchida ............. | H01L 27/14609 257/292 |

(Continued)

FOREIGN PATENT DOCUMENTS

| | | | |
|---|---|---|---|
| JP | 2006-120922 A | 5/2006 |
| JP | 2008-252123 A | 10/2008 |

(Continued)

OTHER PUBLICATIONS

International Search Report issued in PCT/JP2013/003096, dated Jul. 16, 2013, with English translation.

*Primary Examiner* — Bitew Dinke
(74) *Attorney, Agent, or Firm* — McDermott Will & Emery LLP

(57) ABSTRACT

A solid-state imaging device includes unit pixels formed on a semiconductor substrate. Each of the unit pixels includes a photoelectric converter, a floating diffusion, a pinning layer, and a pixel transistor. The pixel transistor includes a gate electrode formed on the semiconductor substrate, a source diffusion layer, and a drain diffusion layer. At least one of the source diffusion layer or the drain diffusion layer functions as the floating diffusion. The pinning layer is covered by the floating diffusion at a bottom and a side at a channel of the pixel transistor. A conductivity type of the floating diffusion is opposite to that of the pinning layer.

8 Claims, 4 Drawing Sheets

(58) Field of Classification Search
CPC ......... H01L 27/14603; H01L 27/14636; H01L 27/14609; H04N 5/3745
See application file for complete search history.

(56) References Cited

U.S. PATENT DOCUMENTS

| | | | |
|---|---|---|---|
| 2005/0230720 A1* | 10/2005 | Miyagawa | H01L 27/14603 257/292 |
| 2006/0050161 A1* | 3/2006 | Inagaki | H04N 5/3577 348/300 |
| 2006/0118835 A1* | 6/2006 | Ellis-Monaghan | H01L 27/14601 257/292 |
| 2006/0145203 A1* | 7/2006 | Toros | H01L 27/14603 257/291 |
| 2006/0214199 A1 | 9/2006 | Inoue et al. | |
| 2007/0090274 A1* | 4/2007 | Lee | H01L 27/14603 250/208.1 |
| 2007/0108371 A1* | 5/2007 | Stevens | H01L 27/14609 250/214.1 |
| 2008/0128767 A1* | 6/2008 | Adkisson | H01L 27/14609 257/292 |
| 2008/0283880 A1* | 11/2008 | Merrill | H01L 27/14609 257/292 |
| 2009/0179232 A1* | 7/2009 | Adkisson | H01L 27/14603 257/229 |
| 2009/0230444 A1* | 9/2009 | Ko | H01L 27/14603 257/292 |
| 2009/0261443 A1* | 10/2009 | Noh | H01L 27/14603 257/443 |
| 2010/0309357 A1* | 12/2010 | Oike | H01L 27/14609 348/302 |
| 2012/0104523 A1* | 5/2012 | Ikeda | H01L 27/14607 257/432 |
| 2012/0153126 A1* | 6/2012 | Oike | H01L 27/14603 250/208.1 |
| 2013/0075591 A1* | 3/2013 | Otake | H01L 27/14623 250/208.1 |
| 2013/0113060 A1* | 5/2013 | Matsunaga | H01L 27/14632 257/431 |
| 2013/0292548 A1* | 11/2013 | Agranov | H01L 27/14643 250/208.1 |
| 2013/0341491 A1* | 12/2013 | Hirose | H01L 27/1464 250/208.1 |
| 2014/0103400 A1* | 4/2014 | Sakata | H01L 27/1463 257/222 |
| 2014/0246706 A1* | 9/2014 | Mori | H01L 27/14609 257/222 |
| 2015/0137199 A1* | 5/2015 | Mori | H01L 27/1461 257/292 |

FOREIGN PATENT DOCUMENTS

| | | | | |
|---|---|---|---|---|
| JP | 2012-060076 A | 3/2012 | | |
| WO | WO 2012005014 A1 * | 1/2012 | ....... | H01L 27/14632 |
| WO | WO 2012176390 A1 * | 12/2012 | ....... | H01L 27/1463 |

* cited by examiner

SOLID-STATE IMAGING DEVICE AND METHOD OF MANUFACTURING THE DEVICE

CROSS-REFERENCE TO RELATED APPLICATIONS

This is a continuation of International Application No. PCT/JP2013/003096 filed on May 15, 2013, which claims priority to Japanese Patent Application No. 2012-143040 filed on Jun. 26, 2012. The entire disclosures of these applications are incorporated by reference herein.

BACKGROUND

The present disclosure relates to solid-state imaging devices and methods of manufacturing the devices.

Reducing dark currents and afterimages in solid-state imaging devices is studied. In order to reduce dark currents and afterimages, providing a pinning layer is suggested. For example, Japanese Unexamined Patent Publication No. 2012-60076 teaches providing a pinning layer of the conductivity type opposite to a charge region (i.e., a floating diffusion (FD)) to reduce contact of a depletion layer generated at the boundary of the pn junction of the FD with the surface of a semiconductor substrate, thereby reducing charge recombination. This structure is expected to reduce dark currents and afterimages caused by a trap level, etc.

SUMMARY

However, in the solid-state imaging device shown in Japanese Unexamined Patent Publication No. 2012-60076, thresholds (Vt) may be different among pixel transistors. The FD is a lightly doped drain (LDD) diffusion layer of each reset transistor to improve image characteristics. In Japanese Unexamined Patent Publication No. 2012-60076, the gate electrodes of the transistors are formed after the pinning layers and the diffusion layers such as the FDs. Then, the gate electrodes may be misaligned. This misalignment of the gate electrodes of the reset transistors causes differences in the amount of the overlap between the diffusion layers and the gate electrodes, which leads to differences in Vt among the reset transistors.

By providing the pinning layers of the conductivity type opposite to the FDs, impurities forming the FDs and impurities forming the pinning layers may cancel each other. Then, overlapping the diffusion layers and the gate electrodes becomes more difficult. The transistors may not operate in the worst case.

Furthermore, the amount of the implanted impurities in forming the FDs is preferably reduced in view of reducing leakages in the FDs. However, when the amount of the implanted impurities decreases, overlapping the diffusion layers and the gate electrodes becomes more difficult.

These problems occur not only in a multilayer image sensor in which a photoelectric conversion film is stacked on a semiconductor substrate with an insulating film interposed therebetween, but also in a surface-type solid-state imaging device in which a photoelectric converter is formed on a surface of a semiconductor substrate.

Specifically, a solid-state imaging device according to one aspect of the present disclosure includes unit pixels formed on a semiconductor substrate. Each of the unit pixels includes a photoelectric converter configured to photoelectrically convert incident light to generate signal charge, a floating diffusion being a diffusion layer formed in the semiconductor substrate and configured to store the signal charge, a pinning layer being a diffusion layer formed in the semiconductor substrate in a position shallower than the floating diffusion, and a pixel transistor including a gate electrode formed on the semiconductor substrate, and a source diffusion layer and a drain diffusion layer formed in the semiconductor substrate at sides of the gate electrode. At least one of the source diffusion layer or the drain diffusion layer functions as the floating diffusion. The pinning layer is covered by the floating diffusion at a bottom and a side at a channel of the pixel transistor. A conductivity type of the floating diffusion is opposite to that of the pinning layer.

A method of manufacturing a solid-state imaging device according to one aspect of the present disclosure includes forming a gate electrode of a pixel transistor on a semiconductor substrate; forming a pinning layer by implanting first impurities into the semiconductor substrate using the gate electrode as a mask; and forming a floating diffusion by implanting second impurities into the semiconductor substrate using the gate electrode as a mask. In the forming the floating diffusion, the second impurities are implanted in a position deeper than the pinning layer, and the floating diffusion is formed to cover the pinning layer at a bottom and a side at a channel of the pixel transistor.

BRIEF DESCRIPTION OF THE DRAWINGS

FIGS. 4A-4D are cross-sectional views illustrating a method of manufacturing the reset transistor of the solid-state imaging device according to the embodiment in order of steps.

DETAILED DESCRIPTION

An image sensor referred to as a "multilayer image sensor" in this embodiment is formed by stacking a photoelectric conversion element (e.g., a photoelectric conversion film) above a semiconductor substrate having a pixel circuit, with an insulating film interposed therebetween. The expression "source/drain diffusion layers" means as follows. When one of two diffusion layers forming a transistor is a source diffusion layer, the other is a drain diffusion layer. When one is a drain diffusion layer, the other is a source diffusion layer.

Figure 1:
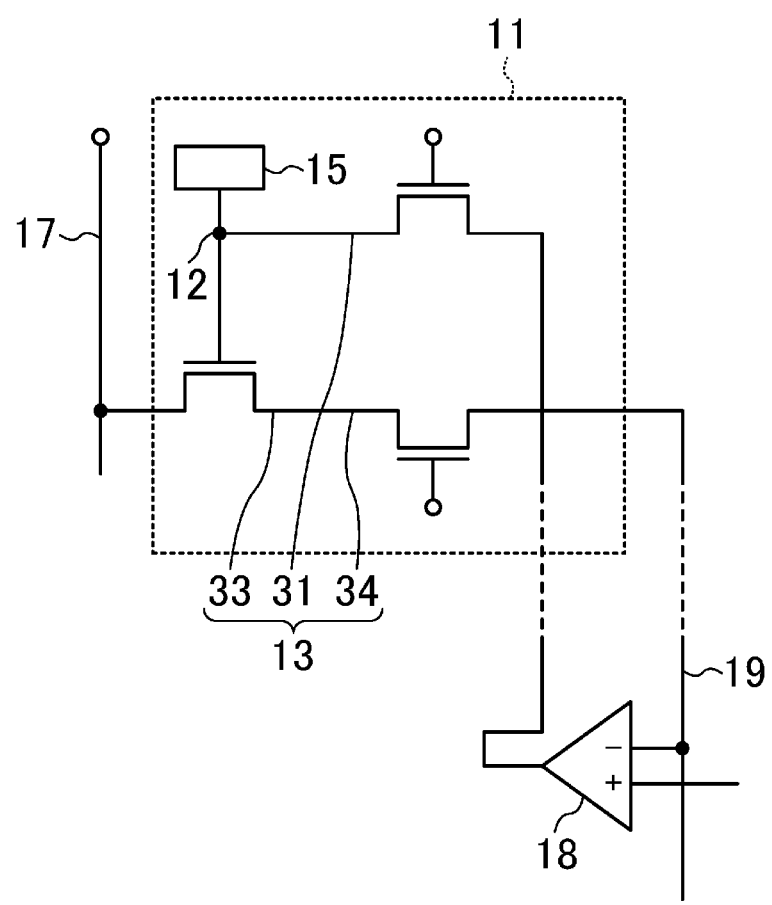
FIG. 1 is a diagram illustrating the circuit configuration of a unit pixel of a solid-state imaging device according to an embodiment.

FIG. 1 illustrates the circuit configuration of a solid-state imaging device according to this embodiment.

A unit pixel 11 includes a photoelectric converter 15, which photoelectrically converts incident light to generate signal charge, a floating diffusion (FD) 12, which stores signal charge generated by the photoelectric converter 15, and a pixel transistor 13.

The pixel transistor 13 includes a reset transistor 31, an amplifier transistor 33, and a selection transistor 34. One of the source/drain diffusion layers of the reset transistor 31 is connected to the photoelectric converter 15, and functions as the FD 12. The gate electrode of the amplifier transistor 33 is connected to the photoelectric converter 15 via the FD 12. One of the source/drain diffusion layers of the amplifier transistor 33 is connected to a power source line 17. The other of the source/drain diffusion layers of the amplifier transistor 33 is connected to one of the source/drain diffusion layers of the selection transistor 34. The other of the source/drain diffusion layers of the selection transistor 34 is connected to a vertical signal line 19. The other of the source/drain diffusion layers of the reset transistor 31 is connected to an output of an amplifier 18 being an operational transistor. One of inputs of the amplifier 18 is connected to the vertical signal line 19. Each pixel transistor 13 has, for example, a lightly doped drain (LDD) structure.

In the multilayer image sensor, the reset transistor 31 is a noise source. Noise generated by the reset transistor 31 is referred to as "kTC noise," which is necessarily generated when the reset transistor 31 is turned on/off. The amplifier 18 is part of a feedback circuit reducing the kTC noise.

A plurality of unit pixels 11 are usually arranged in a matrix. In general, a group of the unit pixels 11 aligned in the same column is connected to a common vertical signal line 19.

Figure 2:
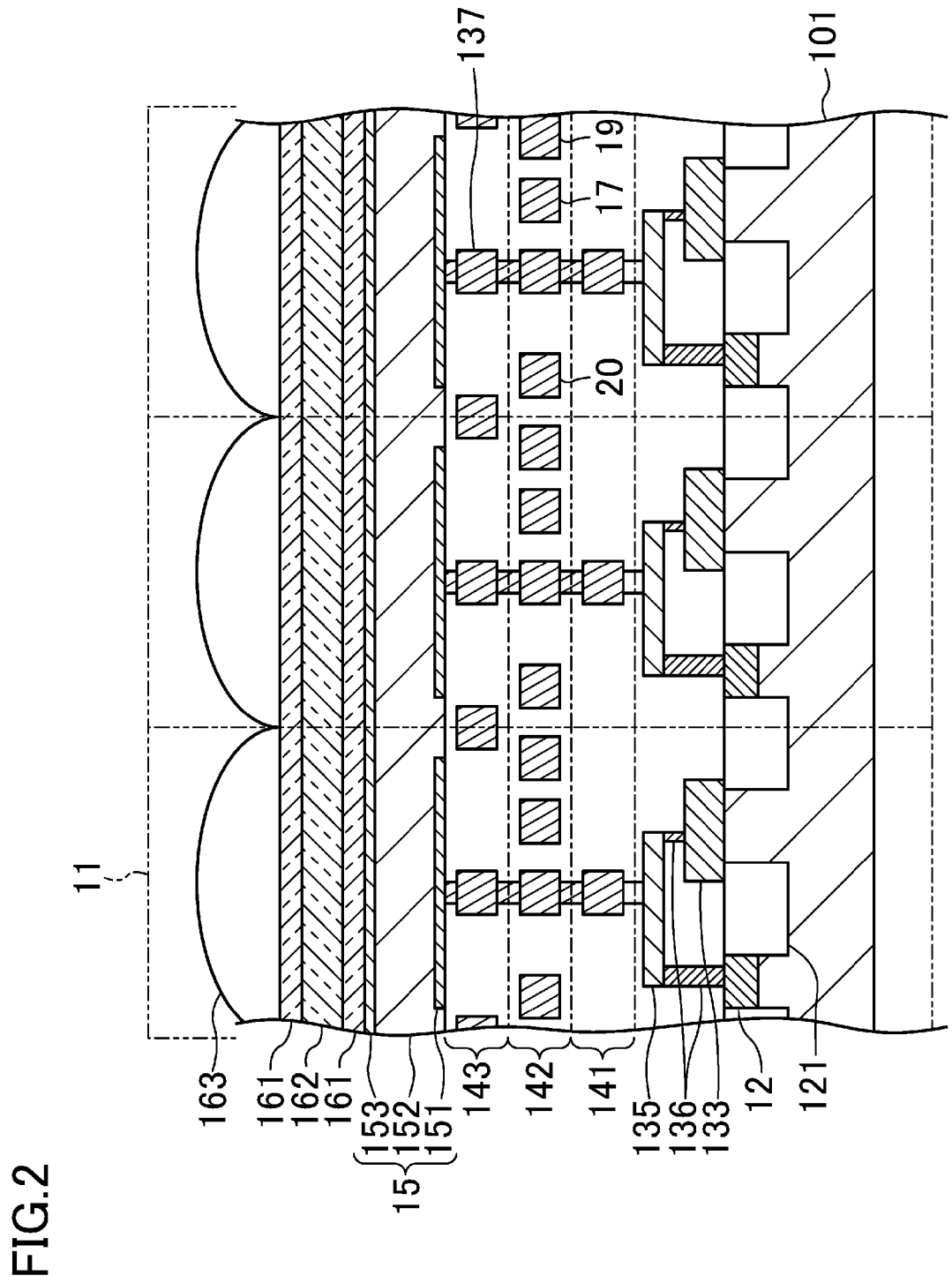
FIG. 2 is a cross-sectional view illustrating the solid-state imaging device according to the embodiment.

FIG. 2 illustrates a cross-sectional structure of the solid-state imaging device according to this embodiment. As shown in FIG. 2, the photoelectric converter 15 is provided above a semiconductor substrate 101. The photoelectric converter 15 includes lower electrodes 151, an organic photoelectric conversion film 152, and an upper electrode 153, which are formed in this order on the semiconductor substrate 101. A color filter 162 and microlenses 163 are formed in this order above the upper electrode 153. Planarizing layers 161 are provided between the upper electrode 153 and the color filter 162, and between the color filter 162 and the microlenses 163. The planarizing layers 161 may be provided as appropriate and may be omitted.

Interconnect layers are formed between the lower electrodes 151 and the semiconductor substrate 101. FIG. 2 shows an example where a first interconnect layer 141, a second interconnect layer 142, and a third interconnect layer 143 are formed in this order above the semiconductor substrate 101. Each interconnect layer includes an insulating layer and interconnects buried in the insulating layer. The number of the interconnect layers may be determined based on the number of needed signal lines. The interconnects may be arranged in any manner. This embodiment shows an example where vertical signal lines 19, power source lines 17, and feedback lines 20 are arranged in the second interconnect layer 142 to extend in the same direction. Each power source line 17 is located between one of the vertical signal lines 19 and one of charge interconnects 137. Each feedback line 20 is located on the opposite side of one of the power source lines 17 with one of the charge interconnects 137 interposed therebetween. The interconnects formed in the interconnect layers may be made of copper.

The gate electrodes of pixel transistors are formed on the semiconductor substrate 101. FIG. 2 illustrates gate electrodes 133 of amplifier transistors 33 only. The gate electrodes 133 are connected to the lower electrodes 151 via contact plugs 136, local interconnects 135, and the charge interconnects 137. Each charge interconnect 137 is formed by connecting copper interconnects in the first interconnect layer 141, the second interconnect layer 142, and the third interconnect layer 143 together. The gate electrodes 133 may be made of polysilicon. The local interconnects 135 may be made of polysilicon.

A plurality of regions are formed in the semiconductor substrate 101 to be isolated from each other by isolation regions 121. Predetermined ones of the regions are FDs 12 being a p-type impurity diffusion layer. The FDs 12 also function as ones of the source/drain diffusion layers of the reset transistors 31. The FDs 12 are connected to the local interconnects 135. The source/drain diffusion layers of the amplifier transistors 33 and the selection transistors 34 are formed in predetermined regions of the semiconductor substrate 101. The conductivity type of the semiconductor substrate 101 is not limited. For example, the diffusion layers may be formed in n-type wells provided in an n-type semiconductor substrate.

A positive bias voltage is applied to the upper electrode 153. When light is incident, holes of electron-hole pairs generated in the organic photoelectric conversion film 152 move to the lower electrodes 151. The holes are collected by the lower electrodes 151 in the respective unit pixels 11, and move to the FDs 12 via the charge interconnects 137, the local interconnects 135, and the contact plugs 136.

While FIG. 2 shows three unit pixels 11, the number of the unit pixels 11 is not limited.

Figure 3:
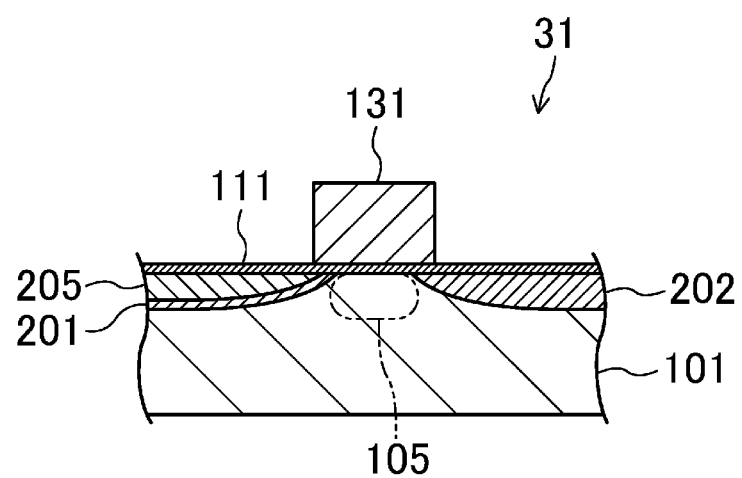
FIG. 3 is a cross-sectional view illustrating a reset transistor of the solid-state imaging device according to the embodiment.

FIG. 3 illustrates an enlarged part of each reset transistor 31. A gate electrode 131 is formed on the semiconductor substrate 101 with a gate insulating film 111 interposed therebetween. The gate insulating film 111 may be, for example, a silicon oxide film with a thickness of 10 nm. The gate electrode 131 may be made of, for example, a polysilicon film with a thickness of 150 nm.

P-type diffusion layers 201 and 202 are formed in the semiconductor substrate 101 at the sides of the gate electrode 131. The region of the semiconductor substrate 101 under the gate electrode 131 between the diffusion layers 201 and 202 is a channel 105 through which carriers move. The diffusion layer 201 functions as the FD 12. The diffusion layers 201 and 202 may be LDD diffusion layers, and may be formed by implanting, for example, boron (B).

A pinning layer 205 being an n-type impurity diffusion layer is formed in the semiconductor substrate 101 in a part shallower than the diffusion layer 201. The pinning layer 205 is covered by the diffusion layer 201 being the FD 12 at the bottom and one side at the channel 105 of the reset transistor 31. The other side of the pinning layer 205 opposite to the channel 105 may have any configuration. For example, the other side may reach an isolation region (not shown). It may be covered by the diffusion layer 201 similar to the one side at the channel 105.

The pinning layer 205 exists, which is of the conductivity type opposite to the diffusion layer 201, thereby preventing or reducing contact of a depletion layer, which is generated at the pn boundary between the diffusion layer 201 and the well, with the surface of the semiconductor substrate 101. As a result, dark currents decrease, which is caused by dangling bond defects of the substrate surface or a trap level.

Figure 4A:
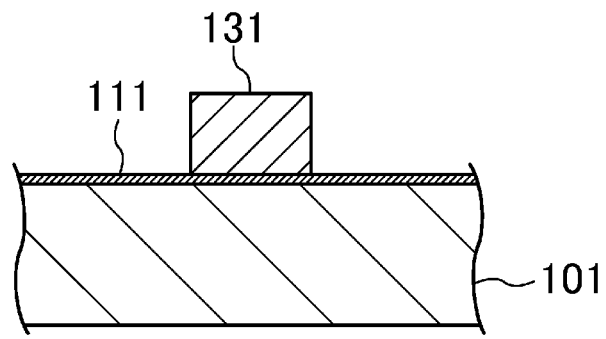
Figure 4B:
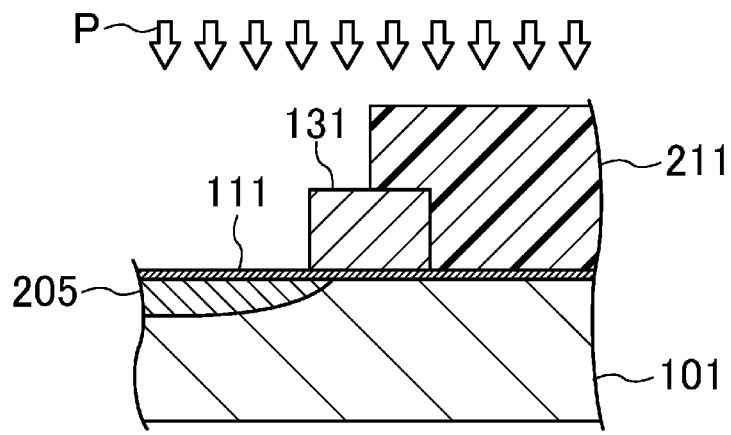
Figure 4C:
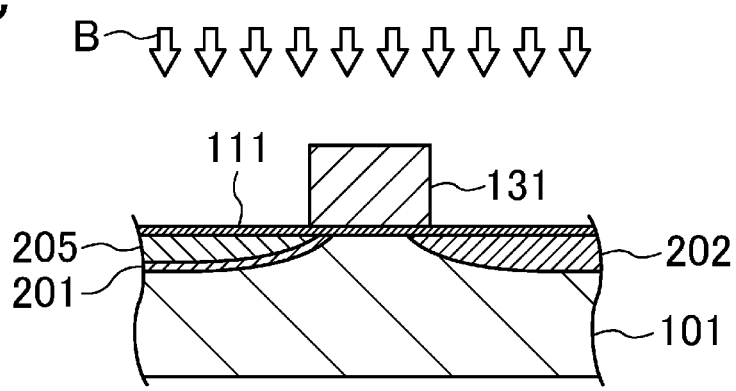

FIGS. 4A-4C illustrate a method of manufacturing each reset transistor 31 according to this embodiment in order of steps.

First, as shown in FIG. 4A, the gate insulating film 111 with a thickness of 10 nm is formed on the semiconductor substrate 101. The isolation region may be formed in advance. Impurities may be implanted in advance to control the threshold voltage of the transistor. Then, after a conductive film with a thickness of 150 nm is deposited, the gate electrode 131 is electrically formed in a predetermined region by lithography and dry etching.

Next, as shown in FIG. 4B, a resist mask 211 is formed, which has an opening above the region of the reset transistor 31 to be the FD 12. After that, phosphorus (P) is implanted, for example, under the conditions of an energy of 10 keV and a dose of $1 \times 10^{12}$ cm$^{-2}$ to form the pinning layer 205.

Then, as shown in FIG. 4C, boron (B) is implanted under the conditions of an energy of 10 keV and a dose of $6 \times 10^{12}$ cm$^{-2}$ to form the diffusion layers 201 and 202. The boron is also implanted into the gate electrode 131 to form the diffusion layers 201 and 202 in self-alignment using the gate electrode 131 as a mask. After that, boron may be implanted into the FD 12 to form a contact, and thermal treatment may be performed to activate the impurities.

In forming the diffusion layer 201 and the diffusion layer 202, the diffusion layer 201 being the FD 12 covers the pinning layer 205 in the depth direction of the semiconductor substrate 101 and in the direction toward the channel 105 of the reset transistor 31. In order to reliably overlap the gate electrode 131 and the diffusion layer 201, the boron ions are preferably implanted by inclined ion implantation. For example, the impurities are implanted at an angle of 25 degrees from the vertical direction of the gate electrode. The impurities may be implanted into the gate electrode in multiple steps such that the source-side diffusion layer and the drain-side diffusion layer are symmetrical. When a necessary dose is implanted in four divided steps, the orientation flat may be rotated 90 degrees in each step.

The ion implantation is not limited to the above-described conditions. However, the impurity concentration is preferably for example, $10^{18}$ cm$^{-3}$ or less in view of reducing leakages of the FD 12.

In the solid-state imaging device according to this embodiment, the pinning layer 205 of the conductivity type opposite to the FD 12 is formed to avoid or reduce contact of the depletion layer generated at the pn boundary between the diffusion layer 201 and the well with the surface of the semiconductor substrate 101. As a result, dark currents caused by terminating defects and the trap level of the surface of the semiconductor substrate 101 decrease.

The FD 12 and the pinning layer 205 are formed in self-alignment with the gate electrode 131 of the reset transistor 31, thereby controlling the amount of the overlap between the gate electrode 131 and the diffusion layer 201 at high accuracy. Differences decrease among the plurality of reset transistors formed in the semiconductor substrate 101. In order to normally operate the reset transistor 31, the diffusion layer 201 functioning as the FD 12 may cover the pinning layer 205. Thus, the expansion of the diffusion layer 201 in the depth and horizontal directions of the semiconductor substrate 101 may be larger than the pinning layer 205.

In view of reducing leakages in the FD 12, impurities are preferably implanted under a low dose condition to form the diffusion layer 201. Since the inclined ion implantation is utilized in the manufacturing method of this embodiment, the gate electrode 131 reliably overlaps the diffusion layer 201 without increasing the implantation dose in forming the diffusion layer 201.

As a result, leakages of the FD 12 and differences in Vt among the reset transistors 31 decrease.

In this embodiment, an example has been described where the p-type reset transistors are formed, each of which includes the diffusion layer implanted with boron. However, even when n-type reset transistors are formed, leakages of the FDs 12 and differences in Vt among the reset transistors 31 can be reduced by the same method.

As compared to surface-type image sensors, multilayer image sensors require a long time to store photoelectrically converted charge in FDs. It is thus more important in multilayer image sensors to reduce leakages in FDs than in surface-type image sensors. Roughness of images caused by noise at low illuminance is improved by reducing leakages in FDs.

Advantage of reducing differences in Vt among the reset transistors will be described further. As described in the description of FIG. 1, the feedback circuit is connected to the unit pixels to reduce the kTC noise of the reset transistors. The feedback circuit applies tapered gate voltages to the reset transistors in reset operation before exposing the photoelectric converter to light. The differences in Vt among the reset transistors can be canceled by the tapered reset operation which applies the tapered gate voltages to the reset transistors. The method of manufacturing the solid-state imaging device according to this embodiment reduces the differences in Vt. This reduces the variation ranges (the taper oscillation) of the gate voltages applied to the reset transistors in the tapered reset operation, thereby reducing random noise.

The solid-state imaging device according to this embodiment includes the unit pixels formed on the semiconductor substrate. Each unit pixel includes a photoelectric converter photoelectrically converting incident light to generate signal charge, a floating diffusion being a diffusion layer formed in the semiconductor substrate and configured to store signal charge, a pinning layer being a diffusion layer formed in the semiconductor substrate in a shallower position than the floating diffusion, and a pixel transistor including a gate electrode formed on the semiconductor substrate, and a source diffusion layer and a drain diffusion layer formed in the semiconductor substrate at sides of the gate electrode. At least one of the source diffusion layer or the drain diffusion layer functions as the floating diffusion. The pinning layer is covered by the floating diffusion at the bottom and the side at the channel of the pixel transistor.

A method of manufacturing the solid-state imaging device according to the present disclosure includes forming a gate electrode of a pixel transistor on a semiconductor substrate, forming a pinning layer by implanting first impurities into the semiconductor substrate using the gate electrode as a mask, and forming a floating diffusion by implanting second impurities into the semiconductor substrate using the gate electrode as a mask. In the forming the floating diffusion, the second impurities are implanted in a position deeper than the pinning layer, thereby forming the floating diffusion to cover the pinning layer at the bottom and the side at the channel of the pixel transistor.

Thus, the pinning layer and the FD are formed in self-alignment with the gate electrode of the reset transistor being the pixel transistor. As a result, the amount of the overlap between the gate electrode and the FD is controlled with high accuracy by setting implantation conditions. In order to allow the FD to function as the diffusion layer of the reset transistor, the FD may cover the pinning layer at least at the side of the gate electrode in the depth and horizontal directions. Thus, the expansion of the impurities in the FD in the depth and horizontal directions is greater than the expansion of the impurities in the pinning layer.

In view of reducing leakages in the FD, the impurities are preferably implanted at a low dose to form the FD. In the manufacturing method of this embodiment, the impurities are implanted by the inclined ion implantation to form the FD. Thus, the FD reliably overlaps the gate electrode without unnecessarily increasing the amount of implantation in forming the FD.

In this embodiment, an example has been described using the reset transistors in the multilayer image sensor. Alternatively, reset transistors in a surface-type image sensor reduce dark currents, leakages in FDs, and differences in Vt by using the same structure and manufacturing method as this embodiment.

In this embodiment, an example has been described where the pinning layer is provided in the one of the source/drain diffusion layers of the reset transistor, which functions as the floating diffusion. However, a pinning layer may be provided in the one of the source/drain diffusion layers, which does not function as the floating diffusion. The pinning layer may be provided in the other pixel transistors than the reset transistor. The pinning layer may be provided in a plurality of pixel transistors.

A solid-state imaging device and a method of manufacturing the device according to the present disclosure reduce dark currents and afterimages, differences in Vt among pixel transistors, and leakages in FDs, and are thus useful.

What is claimed is:

1. A solid-state imaging device comprising:
a semiconductor substrate; and
unit pixel cells each including
a photoelectric converter configured to photoelectrically convert incident light to charge,
a diffusion layer, in the semiconductor substrate, connected to the photoelectric converter, the diffusion layer including
a pinning layer, and
a floating diffusion layer for storing the charge and covering an underneath of the pinning layer, and
a pixel transistor including a gate electrode on the semiconductor substrate, and a source and a drain in the semiconductor substrate, the floating diffusion being one of a source and a drain, the pixel transistor being a reset transistor, wherein
a conductivity type of the floating diffusion is opposite to that of the pinning layer,
the pinning layer extends under the gate electrode,
the floating diffusion contains first impurities as dopant, a conductivity type of the floating diffusion being the same as that of the first impurities,
the pinning layer contains second impurities as dopant, a conductivity type of the pinning layer being the same as that of the second impurities,
the gate electrode contains the first impurities and the second impurities as dopant, and
a conductivity type of the entire gate electrode of the pixel transistor is the same as that of the first impurities.

2. The solid-state imaging device of claim 1, wherein the floating diffusion and the pinning layer are a single floating diffusion and a single pinning layer, respectively.

3. The solid-state imaging device of claim 1, wherein the floating diffusion contains boron.

4. The solid-state imaging device of claim 1, wherein the floating diffusion contains impurities at a concentration of $1 \times 10^{18}$ cm$^{-3}$ or less.

5. The solid-state imaging device of claim 1, wherein the floating diffusion covers a bottom and a side of the pinning layer, the side of the pinning layer being on a side of the gate electrode.

6. The solid-state imaging device of claim 1, wherein the gate electrode has a thickness greater than that of the floating diffusion layer.

7. The solid-state imaging device of claim 1, wherein a size of the source is substantially the same as a size of the drain.

8. The solid-state imaging device of claim 1, wherein a part of the source and a part of the drain are disposed under the gate.

* * * * *